(12) United States Patent
Carbone et al.

(10) Patent No.: US 8,718,178 B1
(45) Date of Patent: May 6, 2014

(54) SELECTION OF NON-LINEAR INTERFERENCE CANCELATION (NLIC) INPUT

(71) Applicant: QUALCOMM Incorporated, San Diego, CA (US)

(72) Inventors: Nicholas Michael Carbone, San Diego, CA (US); Roberto Rimini, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/075,718

(22) Filed: Nov. 8, 2013

(51) Int. Cl.
*H04B 15/00* (2006.01)
*H04L 25/49* (2006.01)
*H03D 1/04* (2006.01)

(52) U.S. Cl.
USPC ............................. 375/285; 375/296; 375/346

(58) Field of Classification Search
CPC .. H04B 1/0475; H04B 10/2507; H04B 10/58; H04B 10/697; H04B 2001/0441; H04B 2210/252; H04B 2210/254; H03F 1/26; H03F 1/32; H03F 1/3241; H03F 1/3258; H03F 2201/3224
USPC ................. 375/259, 285, 295, 296, 316, 346; 329/318, 349; 332/106, 107, 117, 123, 332/124, 125, 149, 159
See application file for complete search history.

(56) References Cited

U.S. PATENT DOCUMENTS

| | | | |
|---|---|---|---|
| 7,187,916 B2 * | 3/2007 | Mo et al. ........................ 455/323 |
| 7,856,048 B1 * | 12/2010 | Smaini et al. .................. 375/221 |
| 8,290,458 B2 * | 10/2012 | Safavi ........................ 455/226.1 |
| 8,605,815 B2 * | 12/2013 | Utsunomiya et al. ......... 375/296 |
| 2012/0288039 A1 | 11/2012 | Kim et al. |
| 2013/0044791 A1 | 2/2013 | Rimini et al. |
| 2013/0077657 A1 | 3/2013 | Wang et al. |
| 2013/0142273 A1 | 6/2013 | Sollenberger et al. |
| 2013/0148711 A1 | 6/2013 | Abrishamkar et al. |
| 2013/0285743 A1 * | 10/2013 | Onishi ........................... 330/149 |

* cited by examiner

*Primary Examiner* — Tesfaldet Bocure
(74) *Attorney, Agent, or Firm* — DeLizio Gilliam, PLLC (57) ABSTRACT

Self-jamming interference associated with a transmitted signal of an aggressor transmitter may affect a received signal of a victim receiver in a communication device. An aggressor transmitter may provide two or more non-linear interference cancelation (NLIC) signals, including a first NLIC signal and a second NLIC signal. A NLIC unit may reconstruct an interference signal based on a selected one of the first NLIC signal or second NLIC signal. Power of the transmitted signal at the aggressor transmitter may be used to select either the first interference cancelation signal or the second interference cancelation signal. The first and second NLIC signals may differ by the use of digital pre-distortion (DPD) at the aggressor transmitter.

20 Claims, 8 Drawing Sheets

| Output Power (dBm) | Pre-DPD MSE (dB) | Post-DPD MSE (dB) |
|---|---|---|
| 20.8 | 31.1 | 39.1 |
| 24.4 | 26.4 | 30.1 |
| 26.5 | 24.4 | 23.6 |
| 28.2 | 22.6 | 15 |

FIG. 6A

| Power of Transmitted Signal | Pre-DPD or Post-DPD NLIC Signal? |
|---|---|
| <25 dBM | Use Post-DPD NLIC Signal |
| >=25 dBM | Use Pre-DPD NLIC Signal |

SELECTION OF NON-LINEAR INTERFERENCE CANCELATION (NLIC) INPUT

BACKGROUND

Embodiments of the present disclosure generally relate to the field of signal processing, and, more particularly, to non-linear interference cancelation (NLIC) of a self-jamming signal.

Wireless communication systems are widely deployed to provide various types of content such as voice, data, and so on. It is common to integrate multiple radios into a single communication device. For example, smartphones may have radios to support cellular communication, WiFi™, GPS, and Bluetooth®, etc., with each radio operating on a different frequency band. A communication device may include a first communication unit implementing a first network technology (e.g., a wide area network, WAN, technology) and a second communication unit implementing a second network technology (e.g., a local area network, LAN, technology). Each communication unit may be capable of transmitting and receiving messages in accordance with a protocol for the respective network technology.

Self-jamming interference refers to interference of a received signal at a victim receiver and that may be associated with leakage of transmitted signals that are simultaneously transmitted by one or more aggressor transmitters of a same communication device. The interference with the received signals attributable to the transmitted signals may degrade the performance of the affected communication device. Non-linear interference cancelation (NLIC) refers to the removal at least part of the self-jamming interference from a received signal.

SUMMARY

Various embodiments are disclosed for mitigating self-jamming interference attributable to a transmitted signal from an aggressor transmitter. A component (such as a digital pre-distortion (DPD)) of the aggressor transmitter may introduce distortions in the transmitted signal that affect a received signal at a victim receiver. An aggressor transmitter may be capable of providing two or more different NLIC signals, including a first NLIC signal and a second NLIC signal. For example, the first NLIC signal may be based, at least in part, on a source transmit signal prior to digital pre-distortion (DPD) at the aggressor transmitter. The second NLIC signal may be based, at least in part, on the source transmit signal after DPD. NLIC may include preparing a cancelation signal using the selected one of the first NLIC signal (e.g., a pre-DPD transmit signal) or the second NLIC signal (e.g., a post-DPD transmit signal). In one embodiment, a selection is made between the first NLIC signal and the second NLIC signal based, at least in part, on a power of the transmitted signal at the aggressor transmitter.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present disclosure. However, it is understood that the described embodiments may be practiced without these specific details. For instance, although examples refer to a DPD unit introducing nonlinear distortions in a transmitted signal, other components of the transmitter may introduce linear or nonlinear distortions into a transmitted signal. Furthermore, although examples refer to a power level of the aggressor transmitter, other characteristics may be used to select between a first NLIC signal and a second NLIC signal. In other instances, well-known instruction instances, protocols, structures and techniques have not been shown in detail in order not to obfuscate the description.

In a communication device affected by self-jamming interference the transmitted signal of an aggressor transmitter may be known. Hence, the communication device may reconstruct the interference components of the transmitted signal affecting the received signal of the victim receiver (hereinafter, victim received signal, or received signal). The reconstructed interference component may be determined using an adaptive NLIC technique. For example, an NLIC module may generate an estimate of the interference component included in the received signal based, at least in part, on a known transmitted signal. The estimate of the interference component attributed to the transmitted signal may be referred to as an interference cancelation signal (hereinafter, cancelation signal). As part of the NLIC technique, the victim receiver may remove the cancelation signal from the received signal to cancel or to mitigate the self-jamming interference. Cancelation efficiency refers to the extent to which components of a transmitted signal that interfere with a received signal are canceled from the received signal.

In an aggressor transmitter of the communication device, a transmitted signal may undergo processing at various components of the transmitter. For instance, a transmitted signal may be sent to a driver amplifier (DA) before it is sent to a power amplifier (PA). These components of the transmitter, in addition to other transmitter components, may introduce distortions (referred to as transmitter distortions) into the transmitted signal. To account for the transmitter distortions, a digital pre-distortion (DPD) unit of the transmitter may intentionally introduce DPD distortions into a source transmit signal. A source transmit signal undergoes distortion at the DPD unit or other component of the transmitter. The DPD unit may distort the source transmit signal to counteract transmitter distortions. Ideally, the DPD distortions offset the transmitter distortions so that the transmitted signal is linearized with respect to the source transmit signal. A source transmit signal that has not been distorted via DPD may be referred to as a pre-DPD transmit signal. A source transmit signal that has been distorted via DPD may be referred to as a post-DPD transmit signal.

Cancelation efficiency of the NLIC technique may be different when the first NLIC signal (e.g., the pre-DPD transmit signal) or the second NLIC signal (e.g., the post-DPD transmit signal) is selected as a basis for reconstructing transmitter interference. In various embodiments, the power of a transmitted signal at an aggressor transmitter may be used to select between the first NLIC signal and the second NLIC signal. For example, depending on the power of the transmitted signal, the interference cancelation may be more effective using a post-DPD transmit signal than a pre-DPD transmit signal, or vice versa. Additionally, the power of a transmitted signal may be used to estimate whether harmonic distortions from the transmitted signal are expected to interfere with the received signal.

Figure 1:
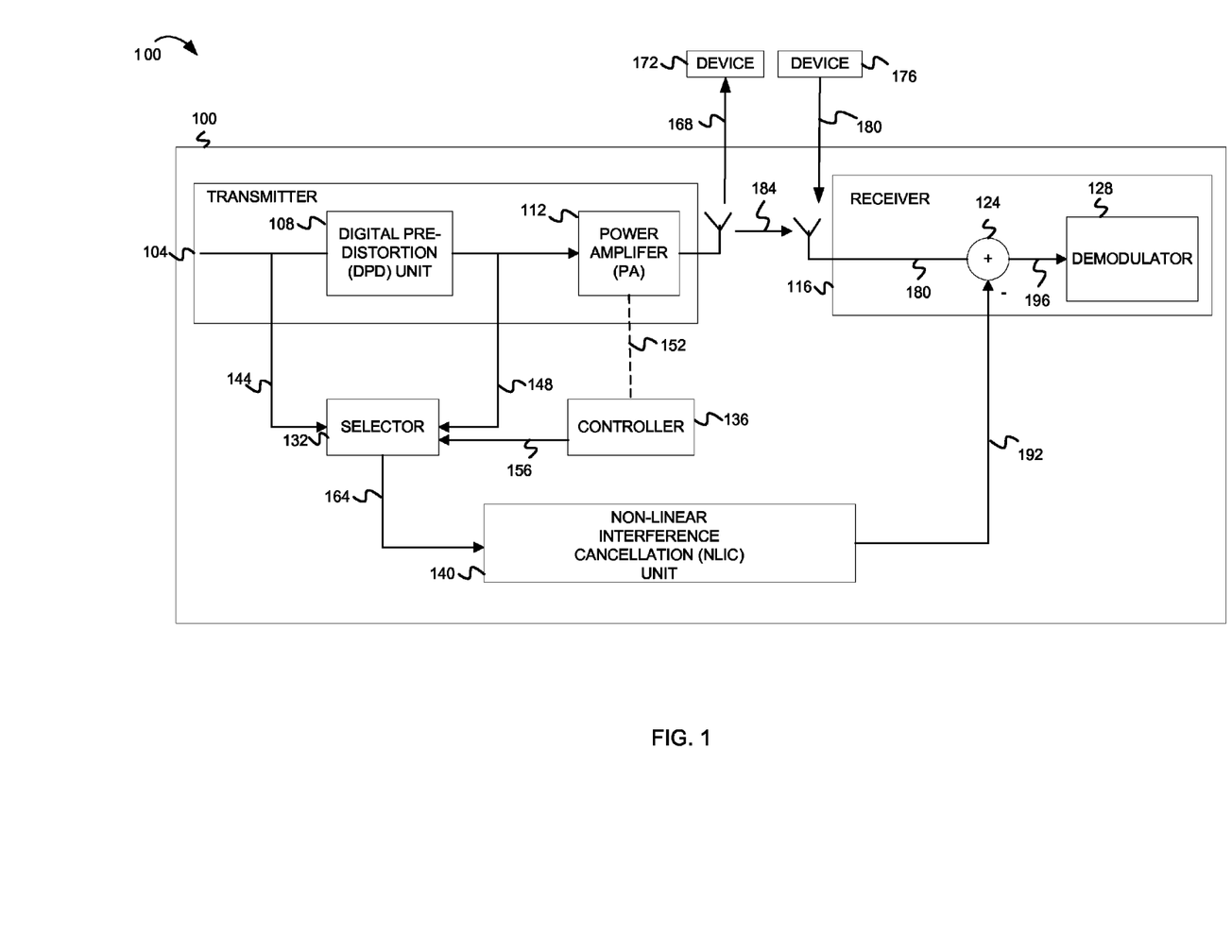
FIG. 1 depicts an example communication device configured to perform NLIC based, at least in part, on power of an aggressor transmitter in accordance with an embodiment of this disclosure.

FIG. 1 depicts a communication device 100 that includes a transmitter 104 (e.g., aggressor transmitter) and a receiver 116 (e.g., victim receiver). The communication device 100 also includes a controller 136, a selector 132, and an NLIC unit 140 which may embody various features of this disclosure. In some embodiments, the controller 136, selector 132, and NLIC unit 140 may be included in the receiver 116, or as part of another hardware component separate from the transmitter 104 and receiver 116. In other embodiments, a subset of the controller 136, selector 132, and NLIC unit 140 may be included in the receiver 116, or the transmitter 104, or as part of another hardware component separate from the transmitter 104 and receiver 116. In one example embodiment, the selector 132 and controller 136 may be located as part of the transmitter 104 and the NLIC unit 140 may be located as part of the receiver 116.

The transmitter 104 includes a DPD unit 108 and a PA 112 as part of the transmitter 104. It should be understood that other components (such as a digital-to-analog converter, filters, etc.) may be present in the transmitter 104. Together the components of the transmitter 104 may be referred to as a transmit chain. The transmitter 104 transmits a transmitted signal 168 to device 172 (such as a base station, a communication device, or the like). The transmitted signal 168 may cause self-jamming interference in a received signal 180 received from device 176 (such as an access point, communication device, or the like) by the receiver 116. For example, components of the transmitted signal may leak to a receive chain through the finite isolation between the transmit chain and the receive chain of the communication device. In one example, non-linearities present in the transmit chain may generate spectral re-growth of the transmitted signal that falls in the received frequency band of the victim receiver and causes self-jamming interference. The self-jamming interference may be referred to as transmitter interference 184. The distortions caused by the transmitter interference 184 may depend, at least in part, on the power of the transmitted signal 168.

The receiver 116 includes a subtraction unit 124 and a demodulator 128. Other components (such as analog-to-digital converter, filters, etc.) might be present in the receiver 116. Together the components of the receiver 116 may be referred to as the receive chain. The subtraction unit 124 (e.g., a summer) of the receiver 116 may cancel at least a portion of the transmitter interference 184 propagated in the received signal 180. The subtraction unit 124 may subtract a cancelation signal 192 prepared by the NLIC unit 140 from the received signal 180 to cancel or mitigate at least part of the transmitter interference 184. Thus, the output of the subtraction unit 124 is an improved received signal 196 (having at least some of the transmitter interference 184 removed) that is sent to the demodulator 128.

The cancelation signal 192 might be produced at an NLIC unit 140. The NLIC unit 140 estimates the cancelation signal 192 as a weighted sum of polynomial terms of a selected NLIC signal 164. The selected NLIC signal 164 may be a pre-DPD transmit signal 144 (first NLIC signal) or a post-DPD transmit signal 148 (second NLIC signal). The NLIC unit 140 applies a distortion to the selected NLIC signal 164 from transmitter 104 to construct an estimate of the transmitter interference 184. The polynomial terms may be weighed by weight estimates from an adaptive filter and summed to generate an estimated cancelation signal 192 for the subtraction unit 124. Thus, the cancelation signal 192 may constitute reconstructed transmitter interference 184.

The power of the transmitted signal 168 may be used to determine whether to select a pre-DPD transmit signal 144 or a post-DPD transmit signal 148 as the selected NLIC signal 164. For example, if the power of the transmitted signal 168 is below (or, in an alternative embodiment, above) a threshold level, then the controller 136 may instruct the selector 132 to send the post-DPD transmit signal 148 to the NLIC unit 140 for interference reconstruction. If the power of the transmit signal 168 is above (or, in the alternative embodiment, below) the pre-determined level, then the controller 136 may instruct the selector to send a pre-DPD transmit signal 144 to the NLIC unit 140 for interference reconstruction. In other embodiments, characteristics in addition to or other than the power of the transmitted signal 168 may be used to select either a pre-DPD transmit signal 144 or a post-DPD transmit signal 148 as the selected NLIC signal 164. For example, in one implementation, envelope tracking (ET) may be used as a criterion to select between a pre-DPD transmit signal 144 or a post-DPD transmit signal 148 as the selected NLIC signal 164. In ET, the PA power supply is dynamically adjusted to match the envelope of the transmit signal. The ET technique may be used to provide better PA efficiency, and may be used at some power levels but not others. Thus, whether ET is on or off may be used as a criterion to determine whether to use a pre-DPD transmit signal 144 or a post-DPD transmit signal 148 as the selected NLIC signal 164. In another implementation, the modulation bandwidth of the transmitter 104 may be used as a criterion to determine whether to select a pre-DPD transmit signal 144 or a post-DPD transmit signal 148 as the selected NLIC signal 164. The modulation bandwidth of the transmitter 104 is the range of frequencies used to modulate a carrier signal. Combinations of these criteria may also be used in various embodiments.

As described previously, the DPD unit 108 may intentionally introduce DPD distortions to counteract distortions introduced into the transmitted signal 168 by various transmitter 104 components, such as the PA 112. Alternatively (or additionally), the DPD unit 108 may be used to mitigate distortions introduced by a driver amplifier (DA, not depicted). In some implementations, the DPD unit 108 may be calibrated to mitigate distortions caused by multiple components of the transmitter. It should be understood that transmitter distortions and DPD distortions may be different for various harmonic frequencies. Harmonic frequencies are frequencies that are multiples of a fundamental frequency in the transmission. In some implementations, the DPD unit 108 may not adjust for transmitter distortions at the harmonic frequencies. Alternatively, the DPD unit 108 may introduce new distortions at the harmonic frequencies. Distortions at the harmonic frequencies are called harmonic distortions. The amount by which DPD distortions cause an interference component of the transmitted signal to interfere with the received signal may depend on a power of the transmitted signal. As such, in one embodiment, the power may be used to select between the pre-DPD transmit signal or the post-DPD transmit signal. In one embodiment, controller 136 may identify a correlation between transmitted signal power and NLIC cancelation efficiency associated with the pre-DPD transmit signal or post-DPD transmit signal.

The power of a transmitted signal may be used to estimate whether harmonic distortions from the transmitted signal are expected to interfere with the received signal. For example, a power of a transmitted signal may impact whether the transmitted signal causes third and fifth harmonic distortions that interfere with a received signal. In one embodiment, the power of the transmitted signal may be used to configure the NLIC unit 140, described further in FIG. 2.

The controller 136 may determine the power (conceptually illustrated as 152) of a transmitted signal 168. The controller 136 may determine the power of the transmitted signal 168 from a variety of sources, including but not limited to, a setting at the PA 112, a register, a message from the transmitter 104, or from a protocol stack associated with the transmitter 104. In one embodiment, the controller 136 may send an instruction 156 to the selector 132 based, at least in part, on the power 152 of the transmitted signal 168. The instruction 156 may cause the selector 132 to pass a selected one of the post-DPD transmit signal 148 or the pre-DPD transmit signal 144 to the NLIC unit 140.

In the example above, the first NLIC signal and the second NLIC signal may be distinguished based on the DPD distortion. However, in other embodiments, the first NLIC signal and the second NLIC signal may be distinguished by other characteristics. For example, a second NLIC signal might be altered by another component of the communication device 100 such that the second NLIC signal is different from the first NLIC signal. Depending upon characteristics of the transmitted signal 168, such as the distortions present at various harmonics of the transmitted signal 168, the cancelation signal 192 might be based, at least in part, on either the first NLIC signal or the second NLIC signal, wherein the processing of the second NLIC signal differs from the processing of the first NLIC signal in cancelation efficiency. Example characteristics include the power of the transmitted signal 168, frequency of the transmitted signal 168, etc.

Figure 2:
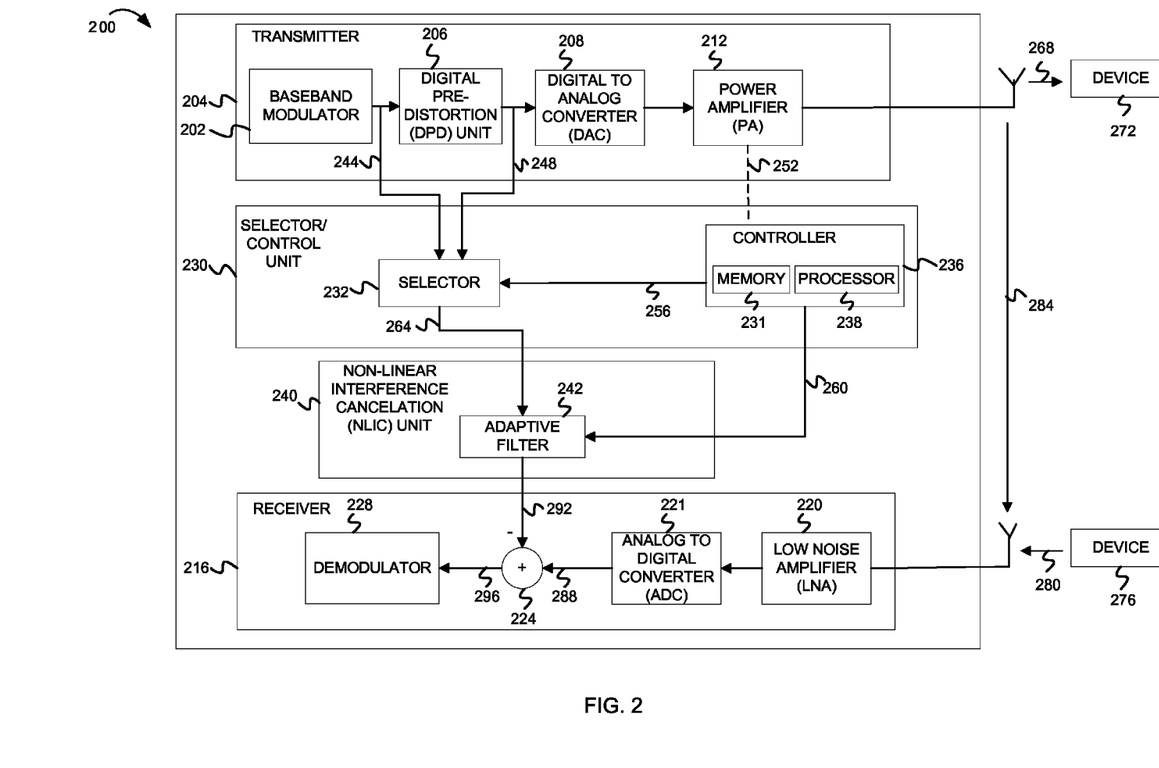
FIG. 2 depicts another example of a device configured to perform NLIC using a selected pre-DPD transmit signal or post-DPD transmit signal based, at least in part, on a power of a transmitted signal in accordance with an embodiment of this disclosure.

FIG. 2 depicts a transceiver 200 in accordance with an embodiment of this disclosure. The transceiver 200 may include a transmitter 204, a receiver 216, a selector/control unit 230, and an NLIC unit 240. The transmitter 204 may include a baseband modulator 202, a DPD unit 206, a digital to analog converter (DAC) 208 and a PA 212. Transmitter 204, similar to transmitter 104, may be capable of distorting a transmitted signal using the DPD unit 206. A pre-DPD transmit signal 244 and a post-DPD transmit signal 248 may have similar meanings as corresponding pre-DPD transmit signal 144 and post-DPD transmit signal 148, respectively of FIG. 1. The NLIC unit 240 may include an adaptive filter 242. The receiver 216 may include a low noise amplifier (LNA) 220, an analog to digital converter (ADC) 221, a subtraction unit 224, and a demodulator 228.

The selector/control unit 230 may include a selector 232 and a controller 236, similar to selector 132 and controller 136, respectively. In FIG. 2, the controller 236 may include a memory 231 and a processor 238. The memory 231 may store instructions, which, when executed by processor 238, cause the controller 236 to manage the selector 232 and/or the adaptive filter 242, as described further in this figure.

The baseband modulator 202 may generate a source transmit signal. The baseband modulator 202 may send the source transmit signal to a DPD unit 206. A pre-DPD transmit signal 244 is associated with the source transmit signal prior to the effects of the DPD unit 206. The DPD unit 206 is configured to distort (e.g., introduce DPD distortions) the source transmit signal to counteract linear and/or nonlinear distortions associated with the PA 212 or other non-linear distortions introduced into the transmit signal via the transmit chain. Ideally, the DPD distortions offset the transmitter distortions (such as the PA distortions) so that the transmit signal 268 is linearized with respect to the source transmit signal. The output of the DPD unit 206 may be referred to as the post-DPD transmit signal 248. The post-DPD transmit signal 248 may be sent to the DAC 208 where the post-DPD transmit signal 248 is converted to an analog signal suitable for amplification and transmission via the communication medium. The PA 212 amplifies the analog signal based on a power setting and produces the transmitted signal 268. The transmitted signal 268 may be transmitted to another device, such as device 272.

As described previously, self-jamming interference may result from a transmitted signal 268. A portion of the transmitted signal 268 or a harmonic distortion produced by the transmitted signal 268 may interfere with a received signal 280 received by the receiver 216 from device 276. For example, a harmonic distortion of the transmitted signal 268 may fall in the frequency band of the receiver 216. More specifically, a third harmonic distortion (referred to as H3D) of a carrier $f_0$ of the transmitted signal 268 may introduce a spectral sideband at $3f_0$, which may fall in the frequency band of the receiver 216. The self-jamming interference caused by the transmitted signal 268 is depicted as transmitter interference 284.

To counteract at least a portion of transmitter interference 284, the NLIC unit 240 may generate a cancelation signal 292 based on either the post-DPD transmit signal 248 or the pre-DPD transmit signal 244, depending on the power of the transmitted signal 268. At least a portion of the transmitter interference 284 may be represented in the cancelation signal 292; thus, the cancelation signal 292 may be a reconstructed version of the transmitter interference 284. The cancelation signal 292 may be sent to the subtraction unit 224 for cancelation of transmitter interference 284 from the digital received signal 288. In accordance with an embodiment of this disclosure, the NLIC unit 240 receives either the post-DPD transmit signal 248 or the pre-DPD transmit signal 244 depending, at least in part, on the power of the transmitted signal 268.

The controller 236 may determine (depicted as 252) the power of the transmitted signal 268. The controller 236 may use the determined power of the transmitted signal 268 to determine whether a pre-DPD transmit signal 244 or a post-DPD transmit signal 248 should be used by the NLIC unit 240 to generate the cancelation signal 292 thereby reconstructing the transmitter interference 284. In one embodiment, the controller 236 may store information (such as a lookup table) that correlates the power of the transmitted signal 268 and the cancelation efficiency associated with a post-DPD transmit signal 248 and a pre-DPD transmit signal 244. For example, a lookup table stored in the memory 231 of the controller 236 may indicate whether the pre-DPD signal 244 or post-DPD signal 248 should be selected by the selector 232. An instruction 256 from the controller 236 may cause the selector 232 to send the selected NLIC signal (e.g., the pre-DPD transmit signal 244 or the post-DPD transmit signal 248) to the NLIC unit 240.

In various implementations, the selector 232 may be a multiplexer or a switch. For example, the instruction 256 from the controller 236 may cause the selector 232 to switch between two or more NLIC signals (e.g., pre-DPD transmit signal 244 and post-DPD transmit signal 248) that may be sent as an output of the selector 232. The selector may send the selected one of the post-DPD transmit signal 248 or pre-DPD transmit signal 244 to an adaptive filter 242 of the NLIC unit 240. The output of the selector (either the post-DPD transmit signal 248 or the pre-DPD transmit signal 244) is depicted as selected NLIC signal 264.

In one embodiment, the adaptive filter 242 is a polynomial-based filter. In addition to receiving the selected NLIC signal 264 from the selector 232, the adaptive filter 242 may also receive a configuration indicator 260 from the controller 236. The configuration indicator 260 may cause a polynomial generator of the adaptive filter 242 to simulate a polynomial of an order that is commensurate to the expected harmonic distortions caused by the transmitter interference 284. For example, the controller may use the determined power 252 of the transmitted signal 268 to determine the expected harmonic distortions in the received signal 280 due to the transmitter interference 284. A range of power levels of the transmitted signal 268 may be correlated with distortions at a particular harmonic or harmonics of the received signal 280. For example, a particular power range of a transmitted signal 268 might be correlated with distortions at the third and fifth harmonics of the received signal 280. Thus, the configuration indicator 260 will cause the adaptive filter 242 to generate a polynomial with at least third and fifth order terms.

The adaptive filter 242 may generate a cancelation signal 292 based, at least in part, on the configuration indicator 260 and the selected NLIC signal 264. The cancelation signal 292 may be sent to a subtraction unit 224 of the receiver 216. The subtraction unit 224 also may receive the digital received signal 288 from the ADC 221. The digital received signal 288 may be the result of the received signal 280 that has passed through the LNA 220 and ADC 221. At the subtraction unit 224, the cancelation signal 292 and the digital received signal 288 are combined. The resulting output may be referred to as an improved received signal 296, wherein at least a part of the transmitter interference 284 propagated in the received signal 280 has been canceled. The improved received signal 296 may be sent to a demodulator 228 for further processing in the receiver 216.

Various alternatives may be envisioned. For example, in one embodiment, the subtraction may be performed in analog. In this alternative embodiment, the subtraction unit 224 is situated before the LNA 220, and an analog cancelation signal 292 is subtracted from an analog receive signal 280 to generate an analog improved received signal 296, which then may be sent to the LNA 220, to the ADC 221, and to the demodulator 228.

Figure 3:
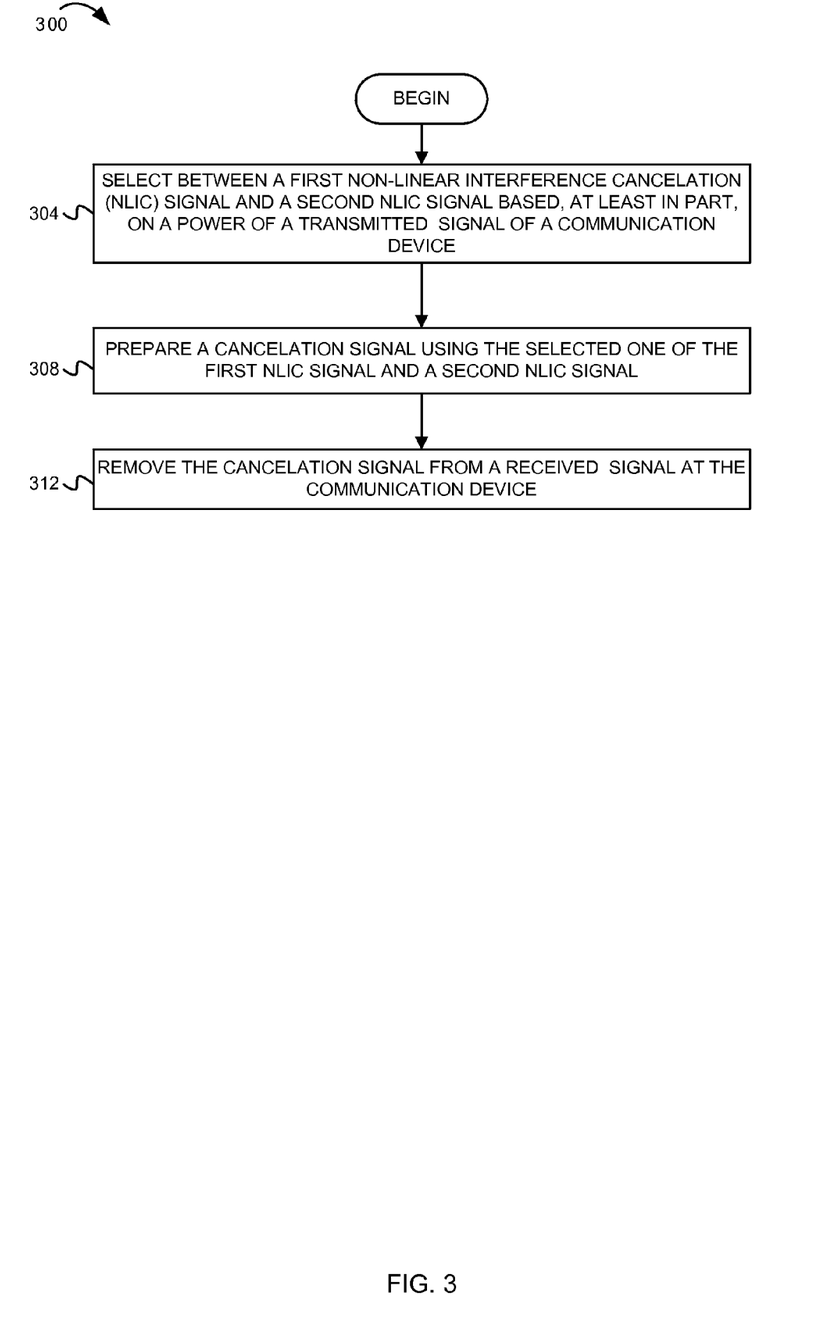
FIG. 3 is a flow diagram illustrating example operations in which power of a transmitted signal may be used to determine whether to perform NLIC using a pre-DPD transmit signal or a post-DPD transmit signal in accordance with an embodiment of this disclosure.

FIG. 3 is a flow chart 300 that depicts example operations to determine whether to generate a cancelation signal based, at least in part, on a first NLIC signal (a pre-DPD transmitted signal) or a second NLIC signal (a post-DPD transmitted signal) using the power of a transmitted signal as a basis for selection. In one embodiment, the operations may be performed by a controller, such as controller 136, 236. At block 304, a selection is made between a first NLIC signal and a second NLIC signal based, at least in part, on the power of a transmitted signal of a communication device. The first NLIC signal may be based, at least in part, on a source transmit signal prior to DPD at a transmitter, and the second NLIC signal may be based, at least in part, on the source transmit signal after the DPD. The flow proceeds to block 308.

At block 308, a cancelation signal is prepared using the selected one of the first NLIC signal and a second NLIC signal. The cancelation signal may be the reconstructed transmitter interference or an approximation of the transmitter interference. In one embodiment, the cancelation signal may be prepared at an adaptive filter of the communication device. The adaptive filter may use the selected NLIC signal (i.e., the first NLIC signal or the second NLIC signal) to reconstruct a cancelation signal. In one embodiment, the adaptive filter includes a polynomial generator that simulates non-linear behavior of a signal as a mathematical calculation. The polynomial generator may select initial values for the coefficients of the mathematical calculation, updating them iteratively based on an error minimization function. Other techniques may be applied wherein one of the first NLIC signal or the second NLIC signal is used as an input to an adaptive filter to generate a cancelation signal, such that the cancelation signal approximates the transmitter interference. For example, Taylor series, Volterra series, or other calculations may be included in the preparation of the cancelation signal.

The flow proceeds to block 312. At block 312, the cancelation signal is removed from a received signal at the communication device. The removal of the cancelation signal from the received signal may occur at a subtraction unit, such as subtraction unit 124, 224. The removal may entail subtracting at least a portion of the cancelation signal from the received signal. The output of block 312 may be an improved received signal wherein at least a portion of the transmitter interference has been canceled from the received signal.

Figure 4:
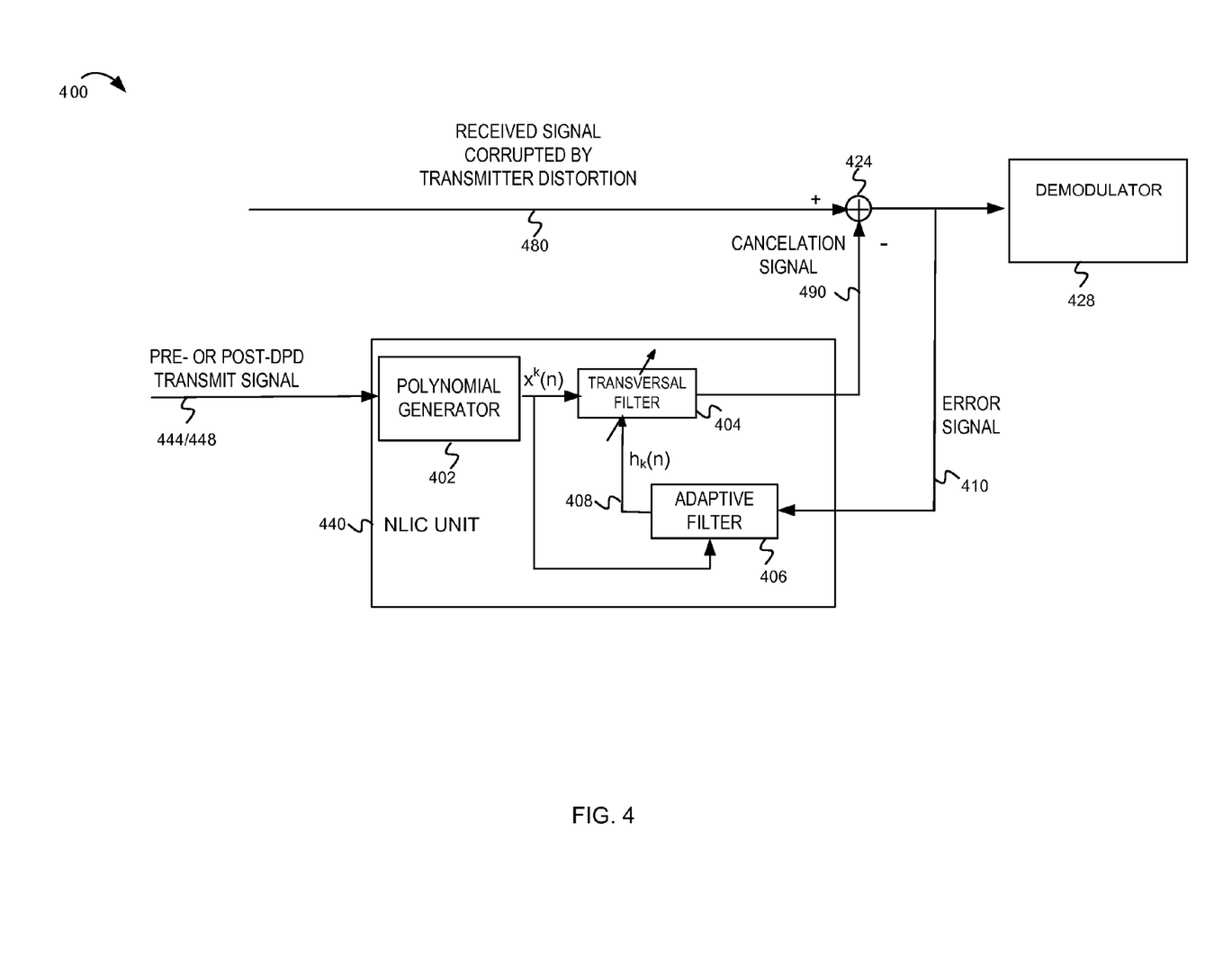
FIG. 4 is an example system diagram illustrating components and usage of an NLIC unit in accordance with an embodiment of this disclosure.

FIG. 4 illustrates an example NLIC unit 440 and the use of the NLIC unit 440 with a receiver. The NLIC unit 440 may include a polynomial generator 402, a transversal filter 404, and an adaptive filter 406. In one embodiment, the NLIC unit 440 may simulate a finite Volterra series, generating a cancelation signal y(n) 490, in which $$y(n) = h\circ + \sum_{m1=0}^{N-1} h_1(m_1)x(n-m_1) + \sum_{m1=0}^{N-1}\sum_{m2=0}^{N-1} h_2(m_1,m_2)x(n-m_1)x(n-m_2) + \ldots + \sum_{m1=0}^{N-1}\ldots\sum_{mk=0}^{N-1} h_k(m_1,\ldots,m_k)x(n-m_1)\ldots x(n-m_k)$$

and in which k is the order of the polynomial, n is time, m is a particular instant in time, $x(n-m_k)$ are inputs, and $h(m_1 \ldots$ $m_k$) are coefficients. In one embodiment, the inputs $x(n-m_k)$ may be the pre-DPD transmit signal 444 or the post-DPD transmit signal 448, depending on the power of the transmit signal as discussed in FIGS. 1-3. The order k of the Volterra series may be established based, at least in part, on the power of a transmit signal as discussed in FIGS. 1-3. The term $h_0$ is the DC term, modeling the system at a frequency equal to zero. After generating the polynomial expression, the polynomial generator 402 may send the polynomial terms to the transversal filter 404. At the transversal filter 404, the polynomial terms are weighed with coefficients and multiplied with these coefficients to generate the cancelation signal $y(n)$ 490 set forth above. Similarly, the polynomial expression also may be sent to an adaptive filter 406 together with an error signal 410. The adaptive filter 406 may determine the correct coefficients to use so that the error is minimized. In some implementations, the adaptive filter 406 can use a least squares (LS), least means squares (LMS), or recursive least squares (RLS) algorithm. However, other algorithms known in the art may be applied.

In one embodiment, after the cancelation signal 490 is subtracted from the received signal 480, the output error signal 410 may be sent to the adaptive filter 406. The adaptive filter 406 may include an error threshold. If the error signal 410 is greater than the error threshold, then the adaptive filter 406 may recalibrate the coefficients. Conversely, if the error signal 410 is less than the error threshold, then the output of the subtraction unit 424, which comprises an improved received signal, may be sent to other components of the receiver for additional processing. For example, the improved received signal may be sent to the demodulator 428.

The demodulator 428 may include a unit to measure bit error rate (BER) or to measure signal to interference and noise ratio (SINR). If the BER or SINR fail to meet certain thresholds stored in the demodulator 428, the demodulator 428 may send the output of the subtraction unit 424 to the adaptive filter 406. At the adaptive filter 406, the coefficients may be recalibrated and sent via signal 408 to the transversal filter 404 to generate an updated cancelation signal 490. Conversely, if the output of the subtraction unit 424 meets the BER or SINR threshold, then the improved received signal may be sent to other receiver components for further processing.

Figure 5:
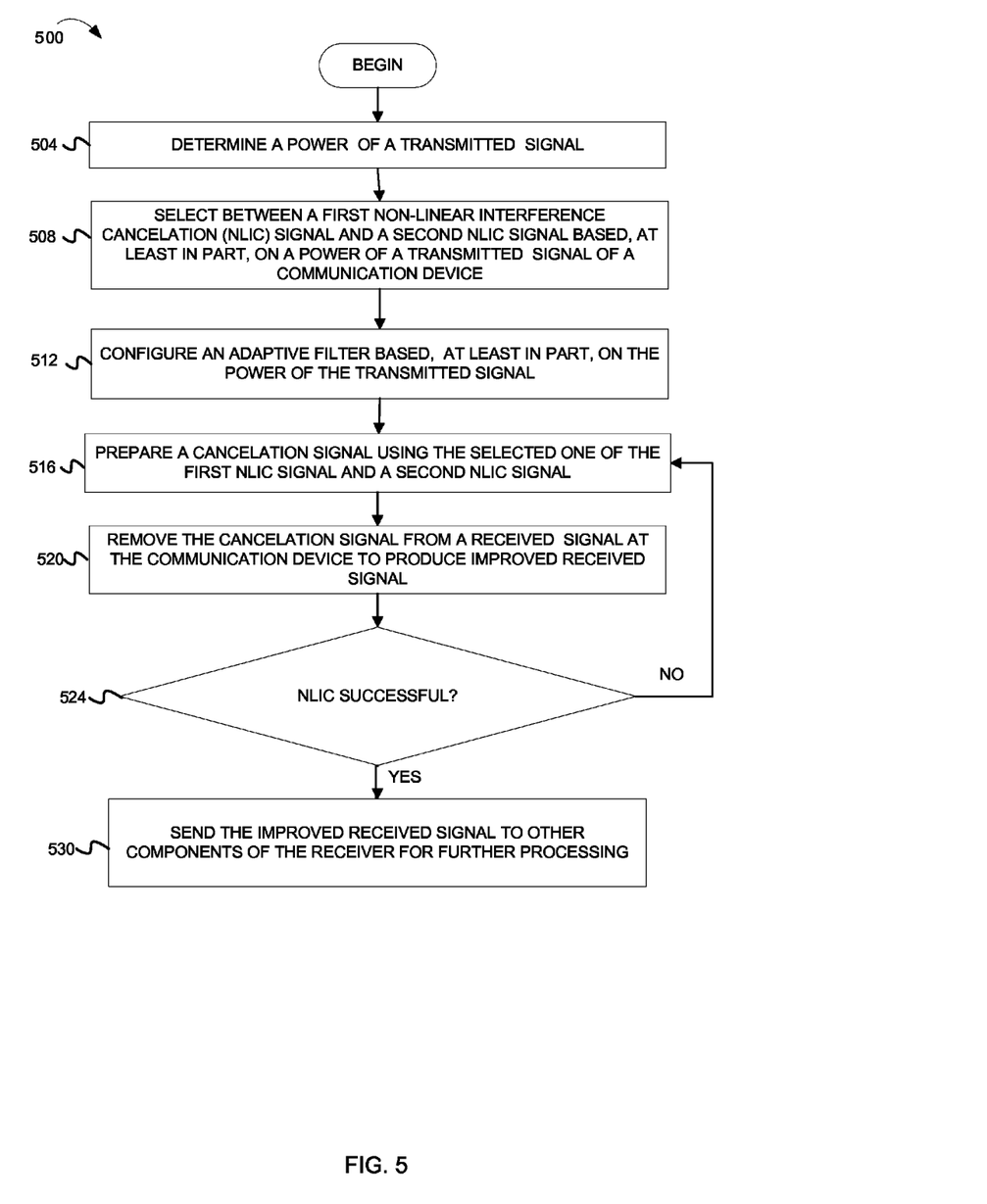
FIG. 5 is another flow diagram illustrating example operations in which NLIC involves reconstructing and canceling self-jamming interference using a selected one of a pre-DPD transmit signal or a post-DPD transmit signal in accordance with an embodiment of this disclosure.

FIG. 5 is another flow diagram 500 illustrating example operations to perform NLIC based, at least in part, on either a first NLIC signal (a pre-DPD transmitted signal) or a second NLIC signal (a post-DPD transmitted signal). In the example in FIG. 5, power of a transmitted signal may be used as a basis for selecting either the first NLIC signal or the second NLIC signal. At block 504, the power of a transmitted signal is determined. In one embodiment, a controller, such as the controller 136, 236, may determine the power of the transmitted signal from the PA. For instance, the controller may determine the power of the transmitted signal based, at least in part, on a configuration or setting of the PA. For example, the PA may be managed by a software or hardware PA controller of the transmitter which may indicate the power of the PA in a memory location. In one embodiment, the controller may be equipped with a memory to store information correlating the power of the transmitted signal and cancelation efficiency using a pre-DPD transmit signal or a post-DPD transmit signal. In another embodiment, the controller may be configured with logic or correlation data that identifies a selected NLIC signal based upon power of the transmitted signal.

At block 508, a selection is made between a first NLIC signal and a second NLIC signal, based, at least in part, on the power of the transmitted signal. For example, a pre-DPD transmit signal may be selected if greater cancelation efficiency may be achieved using a pre-DPD transmit signal for the power of the transmitted signal. Conversely, if greater cancelation efficiency may be achieved using a post-DPD transmit signal for the power of the transmitted signal, then the controller may select the post-DPD transmitted signal. In one embodiment, the controller may be configured to store a correlation between transmitted signal power and NLIC cancelation efficiency associated with using a pre- or post-DPD transmitted signal to generate the cancelation signal. In one implementation, after selecting the first or second NLIC signal, the controller may instruct an adaptive filter to prepare a cancelation signal based, at least in part, on the selected NLIC signal.

At block 512, an adaptive filter may be configured based, at least in part, on the power of the transmitted signal. A controller may store a correlation between the power of a transmitted signal and the expected harmonic distortions in a received signal propagated by the transmitter interference. In one embodiment, the correlation between the power of a transmitted signal and the expected harmonic distortions to be found in a received signal due to the transmitter interference may be stored in a look-up table, a tree, or other suitable data structure. A controller may configure a polynomial generator of the adaptive filter to simulate a polynomial with an order that is commensurate to the distortions expected to be found in the received signal based, at least in part, on the power of the transmitted signal. For example, a particular power range of a transmitted signal might be correlated with expected distortions at the third and fifth harmonics of the received signal. A controller may instruct a polynomial generator of an adaptive filter to simulate a polynomial with third and fifth order terms. In one embodiment, the adaptive filter may simulate non-linear behavior of a signal as a mathematical calculation. The controller may instruct the adaptive filter to simulate the mathematical calculation with a number of terms equal to the types of harmonic distortions expected to be found in the received signal due to the transmitted signal as correlated with the power of the transmitted signal. For example, if, based on the power of the transmitted signal, a received signal is expected to include distortions at the third and fifth harmonics, the controller may instruct the adaptive filter to simulate a mathematical calculation with a third and a fifth order term.

At block 516, a cancelation signal is prepared using the selected one of the first NLIC signal and a second NLIC signal. In one embodiment, an adaptive filter may generate the cancelation signal using either the first NLIC signal or the second NLIC signal as an input. For example, if the adaptive filter simulates a mathematical calculation, the selected one of the first NLIC signal or the second NLIC signal may be an input to the mathematical calculation. As a result of the mathematical calculation, the output of the adaptive filter may be a cancelation signal. The coefficients of the terms of the mathematical calculation may be selected and updated iteratively.

At block 520, the cancelation signal may be removed from the received signal at the communication device to yield an improved received signal. In one embodiment, the cancelation signal may be subtracted from the received signal at a subtraction unit, such as subtraction unit 124, 224, 424.

At decision 524, the communication device may determine whether the NLIC technique was successful. For example, the communication device may compare an error signal with a threshold to determine if the NLIC technique was successful. If successful, the flow may proceed to block 530. At block 530, the improved received signal may be sent to other components of the receiver, where the improved received signal may be further processed (e.g., demodulation, decoding, or the like). If not successful, the flow returns to block 516. At block 516, the NLIC unit may employ a feedback process to adjust the cancelation signal. For example, an adaptive filter of the NLIC unit may adjust the coefficients to be supplied to the transversal filter to further minimize the error signal. As such a revised cancelation signal may be prepared at block 516. The flow may return to block 520 where the revised cancelation signal may be removed from the received signal.

Figure 6A:
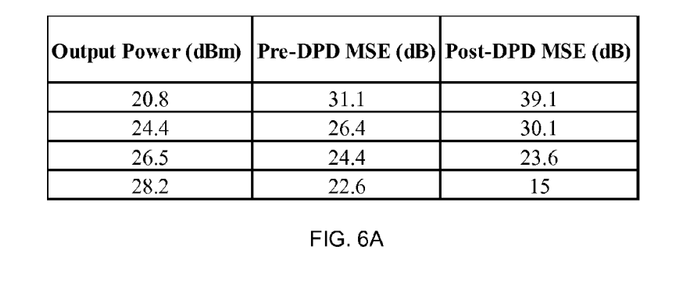
FIG. 6A is a table that depicts an example correlation between the power of a transmitted signal and the relative effectiveness of performing NLIC using the pre-DPD transmit signal or the post-DPD transmit signal in accordance with an embodiment of this disclosure.
Figure 6B:
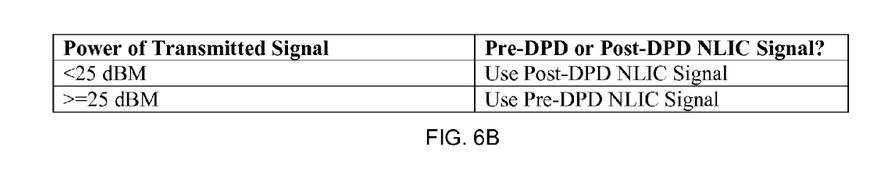
FIG. 6B is a table that depicts example rules for selecting a pre-DPD transmit signal or a post-DPD transmit signal for NLIC based, at least in part, on a transmitted signal power in accordance with an embodiment of this disclosure.

FIGS. 6A and 6B depict the way in which the power/cancelation efficiency information may be stored. In FIG. 6A, the power of a transmitted signal 268 (each row) may correlate to a mean square error cancelation efficiency for a reconstructed pre-DPD transmit signal (column 1 of table 600) and a post-DPD transmit signal (column 2 of table 600). For example, a transmitted signal 268 with a power of 20.8 dBm may have a higher cancelation efficiency using a post-DPD transmit signal (39.1 MSE dB) than using a pre-DPD transmit signal (31.1 MSE dB). A memory 231 of the controller 236 may store the information in the format depicted in FIG. 6A, and a processor 238 of the controller 236 may parse through the table to locate information about the power 252 of the transmitted signal 268.

In FIG. 6B, a power range threshold of a transmitted signal 268 may correlate with an action to reconstruct transmitter interference using a post-DPD transmit signal 248 or a pre-DPD transmit signal 244. For example, a power range of a transmitted signal that is greater than or equal to a threshold of 25 dBm may correspond to an instruction to use a pre-DPD transmit signal 244 to reconstruct transmitter interference. It should be understood that other thresholds and/or ranges could be used in the table.

Figure 7:
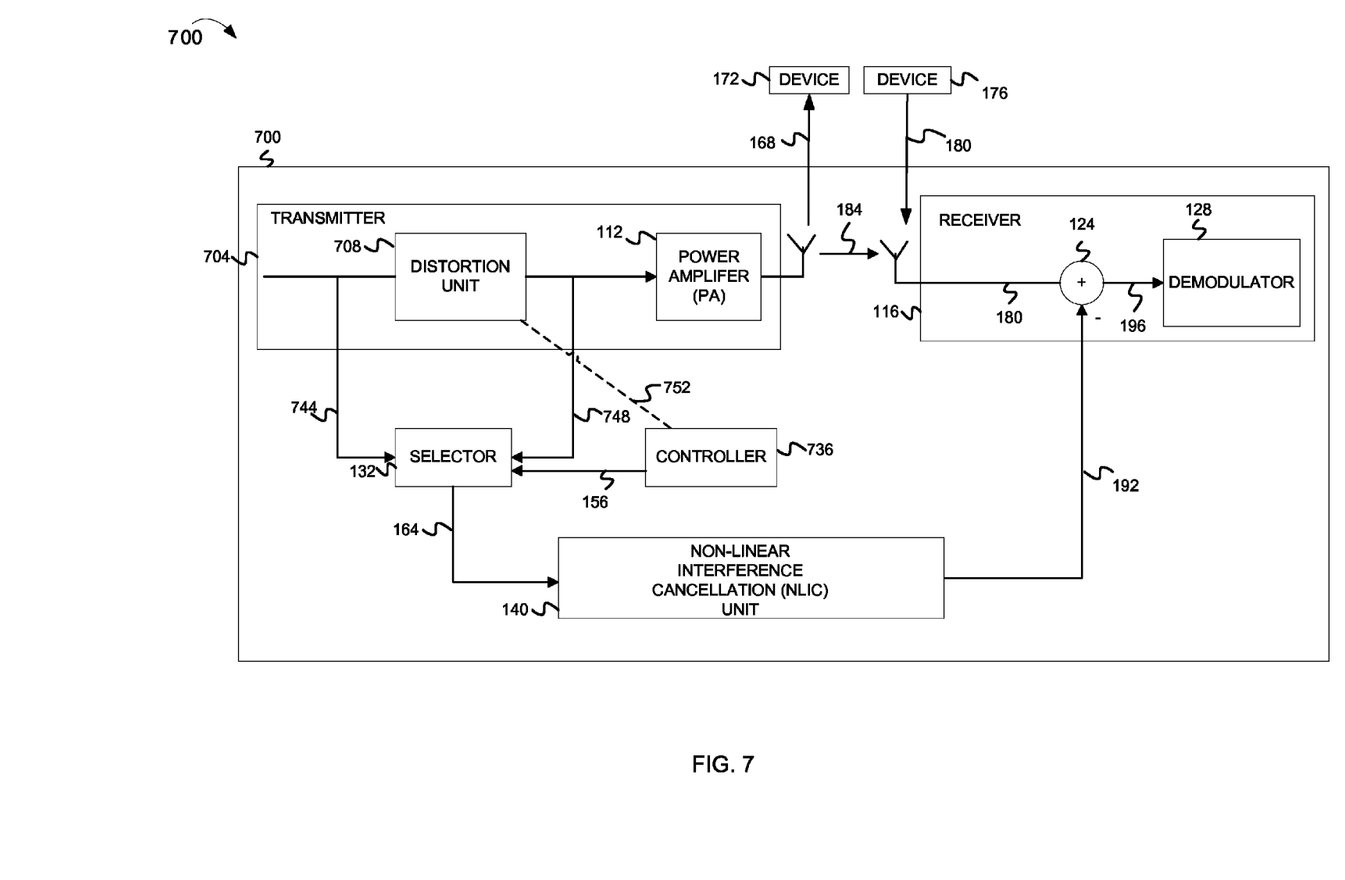
FIG. 7 depicts another example communication device configured to perform NLIC using a selected pre-distortion transmit signal or post-distortion transmit signal in accordance with an embodiment of this disclosure.

FIG. 7 illustrates another example communication device 700 similar to example communication device 100 from FIG. 1. In FIG. 7, like reference numbers refer to similar features previously described in FIG. 1. FIG. 7 illustrates alternative embodiments in which a controller 736 may cause the selector 132 to select between a pre-distortion transmit signal 744 or a post-distortion transmit signal 748 to be used as a basis on which to reconstruct the transmitter interference. The pre-distortion transmit signal 744 and post-distortion transmit signal 748 may represent different optional NLIC signals that could be used with the NLIC unit 140. It should be noted that the pre-distortion transmit signal 744 and post-distortion transmit signal 748 may differ from each other due to DPD distortion or other distortions.

For example, in some implementations, a transmit signal may be distorted at the transmitter 704 using components, such as distortion unit 708, other than or in addition to a DPD unit (not shown). The distortions may be intentional transmitter distortions introduced to mitigate particular unwanted distortions in a transmitted signal 168. For example, the distortion unit 708 may introduce clipping to reduce peak to average power ratio (PAPR) in a transmitted signal 168. In clipping, the amplitude of a signal is capped so that it does not exceed a designated maximum amplitude. A pre-distortion transmit signal 744 (e.g., pre-clipped signal) or post-distortion transmit signal 748 (e.g., post-clipped signal) may be selected as the NLIC signal to send to the NLIC unit 140.

In another implementation, a distortion unit 708 may introduce spectral shaping to compensate for droop in the components of the transmitter 704. Droop may occur when a square wave passes through a high pass filter (not depicted) of the transmitter 704. Droop may eliminate or reduce the low frequency components of the square wave. The distortion unit 708 may comprise a spectral shaping filter to mitigate droop. However, the spectral shaping filter may itself introduce distortions into a transmitted signal 168 that cause distortions in a received signal 180. The pre-distortion transmit signal 744 (e.g., a pre-spectral shaping filtered signal) or the post-distortion transmit signal 748 (e.g., a post-spectral shaping filtered signal) may be used as the NLIC signal to send to the NLIC unit 140.

Whether a pre-distortion transmit signal or a post-distortion transmit signal is selected as the selected NLIC signal 164 sent to the NLIC unit 140 may depend on various physical properties of the transmitter 704 or transmitter interference 184. For example, the controller 736 may determine a configuration or setting (depicted as 752) of the distortion unit 708 (e.g., clipping unit, spectral shaping filter, or other component that introduces transmitter distortions). The controller 736 may cause the selector 132 to select either the pre-distortion transmit signal 744 or the post-distortion transmit signal 748 based, at least in part, on the configuration or setting 752 of the distortion unit 708. In some embodiments, the controller 736 may also configure the NLIC unit based, at least in part, on the configuration or setting 752 of the distortion unit 708.

It should be understood that FIGS. 1-7 and the operations described herein are examples meant to aid in understanding embodiments and should not be used to limit embodiments or limit scope of the claims. Embodiments may perform additional operations, fewer operations, operations in parallel or in a different order, and some operations differently. For example, although the above examples discuss use of an adaptive filter to remove higher order harmonic distortions from a received signal, an adaptive filter also may be configured to remove first order (i.e. linear) distortions.

Embodiments may take the form of an entirely hardware embodiment, a software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein.

Any combination of one or more non-transitory machine-readable medium(s) may be utilized. The non-transitory machine readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Computer program code embodied on a machine readable medium for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
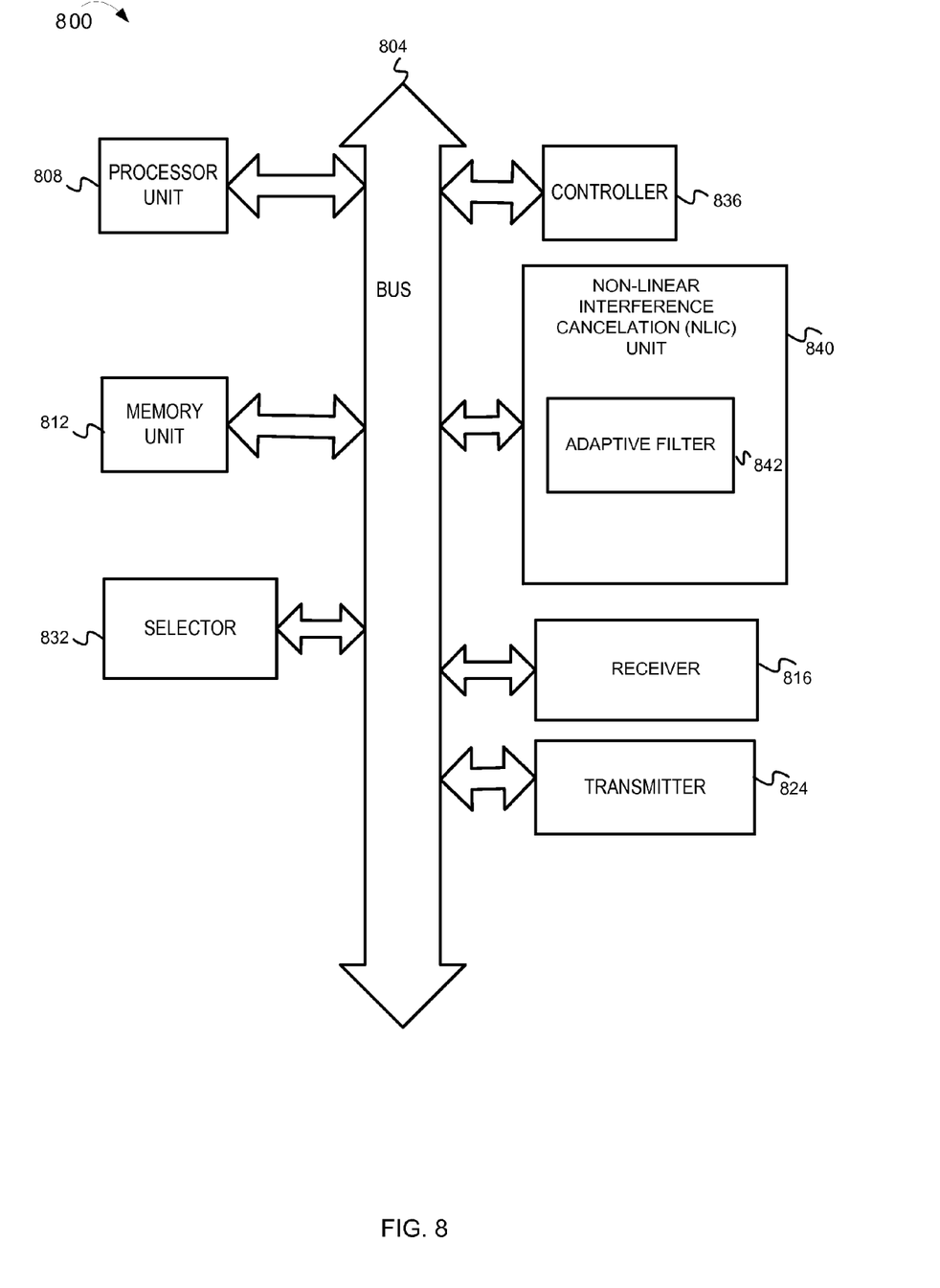
FIG. 8 is a block diagram of a communication device including a mechanism for implementing various embodiments of this disclosure.

FIG. 8 depicts an example communication device 800 that includes a receiver 816, a transmitter 824, and an NLIC unit 840 that includes an adaptive filter 842. The NLIC unit 840 may implement functionality described in this disclosure, such as the functionality associated with NLIC units 140, 240. The communication device 800 may include a processor unit 808 (possibly including multiple processors, multiple cores, multiple nodes, and/or implementing multi-threading, etc.). The communication device 800 may include a memory unit 812. The memory unit 812 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The communication device 800 also includes a bus 804 (e.g., PCI, ISA, PCI-Express, Hyper-Transport®, InfiniBand®, NuBus, etc.).

Additionally, the communication device 800 may include a controller 836. The controller 836 may implement functionality described in this disclosure, such as the functionality associated with controller 136 or controller 236 described previously. In one embodiment, the controller 836 may be implemented as software instruction that determines the power of the transmitted signal based on a configuration of the transmitter 824. In other embodiments, the controller 836 may be implemented as hardware or as a combination of hardware and software.

Additionally, the communication device 800 may include a selector 832. The selector 832 may implement functionality described in this disclosure, such as the functionality associated with the selector 132 or 232. Further, realizations may include fewer or additional components not illustrated in FIG. 8 (e.g., ADCs and other filters not depicted). The processor unit 808, the memory unit 812, the receiver 816, the transmitter 824, the controller 836, the NLIC unit 840, and the selector 832 are coupled to the bus 804. Although illustrated as being coupled to the bus 804, the memory unit 812 may be coupled to the processor unit 808.

While the embodiments are described with reference to various implementations and exploitations, it will be understood that these embodiments are illustrative and that the scope of the disclosure is not limited to them. In general, techniques for causing a first receiver to sense a signal that may interfere with the reception of a second signal at a second receiver as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the disclosure.

What is claimed is:

1. A method comprising:
selecting between a first non-linear interference cancelation (NLIC) signal and a second NLIC signal, the first NLIC signal based, at least in part, on a source transmit signal prior to digital pre-distortion (DPD) at a transmitter of a communication device, and the second NLIC signal based, at least in part, on the source transmit signal after the DPD;
preparing a cancelation signal using the selected one of the first NLIC signal and second NLIC signal; and
removing the cancelation signal from a received signal at the communication device.

2. The method of claim 1, wherein selecting between the first NLIC signal and the second NLIC signal is based, at least in part, on a power of a transmitted signal representing the source transmit signal that is output from the transmitter of the communication device.

3. The method of claim 1, wherein selecting between the first NLIC signal and the second NLIC signal further comprises:
  storing correlation information regarding a plurality of power levels and corresponding selections of the first and second NLIC signals; and
  obtaining the selected one of the first NLIC signal and second NLIC signal by referring to the correlation information and a power of a transmitted signal representing the source transmit signal that is output from the transmitter of the communication device.

4. The method of claim 3, further comprising:
  determining the power of the transmitted signal; and
  determining a corresponding one of the first and second NLIC signals, corresponding to the power of the transmitted signal from the plurality of power levels.

5. The method of claim 1, wherein preparing the cancelation signal comprises configuring an adaptive filter, based, at least in part, on a power of a transmitted signal representing the source transmit signal that is output from the transmitter of the communication device.

6. The method of claim 5, wherein, configuring the adaptive filter comprises:
  determining, based, at least in part, on the power of the transmitted signal, a quantity of polynomial terms to represent an order of a polynomial expression associated with the cancelation signal; and
  generating the quantity of polynomial terms.

7. The method of claim 1, wherein preparing the cancelation signal comprises determining harmonic components of the selected first or second NLIC signal, and generating the cancelation signal as representation of the harmonic components.

8. The method of claim 1, wherein selecting between the first NLIC signal and the second NLIC signal is based, at least in part, on a configuration of a DPD unit of the transmitter.

9. A communication device comprising:
  a transmitter configured to produce a first non-linear interference cancelation (NLIC) signal and a second NLIC signal, the first NLIC signal undistorted via digital pre-distortion (DPD) and the second NLIC signal distorted via DPD;
  a controller configured to select one of the first NLIC signal and the second NLIC signal;
  an NLIC unit configured to prepare a cancelation signal using the selected one of the first NLIC signal and the second NLIC signal; and
  a receiver, wherein the cancelation signal is removed from a received signal.

10. The communication device of claim 9, wherein the controller is configured to:
  determine a power of a transmitted signal representing the source transmit signal that is output from the transmitter of the communication device; and
  select one of the first NLIC signal and the second NLIC signal based, at least in part, on the power of the transmitted signal.

11. The communication device of claim 9, wherein the controller being configured to select one of the first NLIC signal and the second NLIC signal comprises the controller being configured to:
  store correlation information regarding a plurality of power levels and corresponding selections of the first and second NLIC signals; and
  obtain the selected one of the first NLIC signal and second NLIC signal by referring to the correlation information and a power of a transmitted signal representing the source transmit signal that is output from the transmitter of the communication device.

12. The communication device of claim 9, wherein the NLIC unit includes an adaptive filter, and wherein the NLIC unit being configured to prepare the cancelation signal comprises the NLIC unit being configured to configure the adaptive filter based, at least in part, on a power of a transmitted signal representing the source transmit signal that is output from the transmitter of the communication device.

13. The communication device of claim 12, wherein the adaptive filter is configured to:
  determine a quantity and order of terms for a polynomial expression to represent the cancelation signal based, at least in part, on the power of the transmitted signal.

14. A non-transitory machine-readable medium having machine executable instructions which, when executed by a processor of a communication device, cause the communication device to:
  select between a first non-linear interference cancelation (NLIC) signal and a second NLIC signal, the first NLIC signal based, at least in part, on a source transmit signal prior to digital pre-distortion (DPD) at a transmitter of the communication device, and the second NLIC signal based, at least in part, on the source transmit signal after the DPD;
  prepare a cancelation signal using the selected one of the first NLIC signal and second NLIC signal; and
  remove the cancelation signal from a received signal at the communication device.

15. The non-transitory machine-readable medium of claim 14 having machine readable executable instructions, which, when executed by the processor of the communication device, cause the communication device to select between the first NLIC signal and the second NLIC signal based, at least in part, on an output power of a transmitted signal representing the source transmit signal that is output from the transmitter of the communication device.

16. The non-transitory machine-readable medium of claim 14 having machine executable instructions, which, when executed by the processor of the communication device, cause the communication device to:
  store correlation information regarding a plurality of power levels and corresponding selections of the first and second NLIC signals; and
  obtain the selected one of the first NLIC signal and the second NLIC signal by referring to the correlation information and a power of a transmitted signal representing the source transmit signal that is output from the transmitter of the communication device.

17. The non-transitory machine-readable medium of claim 16 having machine executable instructions, which, when executed by the processor of the communication device, cause the communication device to:
  determine the power of the transmitted signal; and
  determine a corresponding one of the first and second NLIC signals, corresponding to the power of the transmitted signal from the plurality of power levels.

18. The non-transitory machine-readable medium of claim 14 wherein the machine executable instructions, which, when executed by the processor of the communication device, cause the communication device to prepare the cancelation signal includes machine executable instructions, which, when executed by the processor of the communication device, cause the communication device to configure an adaptive filter of the communication device based, at least in part, on a power of a transmitted signal representing the source transmit signal that is output from the transmitter of the communication device.

19. The non-transitory machine-readable medium of claim 18 having machine executable instructions, which, when executed by the processor of the communication device, cause the communication device to configure the adaptive filter to:
  determine a quantity and order of terms for a polynomial expression to represent the cancelation signal based, at least in part, on the power of the transmitted signal; and
  generate the polynomial expression.

20. The non-transitory machine-readable medium of claim 15 having machine executable instructions, which, when executed by the processor of the communication device, cause the communication device to:
  collect statistics relating characteristics of the transmitted signal and a quantity of transmitter interference removed from the received signal depending on the selection of the first NLIC signal or the second NLIC signal;
  determine a correlation between the quantity of transmitter interference removed from the received signal, the selection of the first NLIC signal or the second NLIC signal, and characteristics of the transmitted signal; and
  determine, based on the correlation, whether to select the first NLIC signal or the second NLIC signal as a basis on which to prepare the cancelation signal depending on the characteristics of the transmitted signal.

* * * * *